US007955922B2

(12) United States Patent
Nakabayashi et al.

(10) Patent No.: US 7,955,922 B2
(45) Date of Patent: Jun. 7, 2011

(54) MANUFACTURING METHOD OF FIN-TYPE FIELD EFFECT TRANSISTOR

(75) Inventors: Hajime Nakabayashi, Yamanashi (JP);
Takuya Sugawara, Yamanashi (JP);
Takashi Kobayashi, Hyogo (JP);
Junichi Kitagawa, Hyogo (JP);
Yoshitsugu Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 470 days.

(21) Appl. No.: 11/972,989

(22) Filed: Jan. 11, 2008

(65) Prior Publication Data

US 2008/0171407 A1  Jul. 17, 2008

(30) Foreign Application Priority Data

Jan. 17, 2007  (JP) ................... 2007-007934

(51) Int. Cl.
*H01L 21/8238* (2006.01)
(52) U.S. Cl. ................. 438/212; 257/E21.284
(58) Field of Classification Search .......... 438/212; 257/E21.284
See application file for complete search history.

(56) References Cited

U.S. PATENT DOCUMENTS

| 6,228,715 B1 * | 5/2001 | Shimoji | 438/264 |
| 6,252,284 B1 | 6/2001 | Muller et al. | |
| 6,413,802 B1 | 7/2002 | Hu et al. | |
| 2003/0095441 A1 * | 5/2003 | Miida | 365/185.33 |
| 2005/0221513 A1 * | 10/2005 | Yue et al. | 438/14 |
| 2008/0032511 A1 * | 2/2008 | Kabe et al. | 438/771 |

FOREIGN PATENT DOCUMENTS

| JP | 2003-204068 A | 7/2003 |
| JP | 2004-128320 A | 4/2004 |
| JP | 2005-332911 A | 12/2005 |
| JP | 2008-159892 A | 7/2008 |
| KR | 10-2009-0096472 A | 9/2009 |
| WO | WO 2006016642 A1 * | 2/2006 ................... 438/771 |

OTHER PUBLICATIONS

Korean Office action for 10-2008-0004402 dated Nov. 13, 2009.

* cited by examiner

*Primary Examiner* — Bradley K Smith
*Assistant Examiner* — Amar Movva
(74) *Attorney, Agent, or Firm* — Pearne & Gordon LLP

(57) ABSTRACT

A method for manufacturing a fin-type field effect transistor simply and securely by using a SOI (Silicon On Insulator) wafer, capable of suppressing an undercut formation, is disclosed. The method includes forming a fin-shaped protrusion by selectively dry-etching a single crystalline silicon layer until an underlying buried oxide layer is exposed; forming a sacrificial oxide film by oxidizing a surface of the protrusion including a damage inflicted thereon; and forming a fin having a clean surface by removing the sacrificial oxide film by etching, wherein an etching rate $r_1$ of the sacrificial oxide film is higher than an etching rate $r_2$ of the buried oxide layer during the etching.

11 Claims, 4 Drawing Sheets

MANUFACTURING METHOD OF FIN-TYPE FIELD EFFECT TRANSISTOR

FIELD OF THE INVENTION

The present invention relates to a method for manufacturing a fin-type field effect transistor by using a SOI (Silicon On Insulator) wafer.

BACKGROUND OF THE INVENTION

Recent primary concern for the development of a very large scale integration (VLSI) circuit is to increase a driving current of a metal oxide semiconductor field effect transistor (MOSFET) while reducing power consumption thereof. To meet such requirement, it has been investigated to use a material having higher carrier mobility than silicon as a channel material. Though germanium, gallium-arsenic, and so forth are available as semiconductor materials having high carrier mobility, a practical use of them is yet to be accomplished for the reason that their use addresses thermal safety issues or renders it difficult to form a fine semiconductor/insulator interface, and so forth. Accordingly, it has been attempted to increase the driving current by way of miniaturizing the MOSFET by using silicon as a channel material as it was conventionally, and to reduce power consumption by way of suppressing excessive gate leakage current or short channel effect.

To prevent an excessive increase of the gate leakage current while realizing the miniaturization of the MOSFET, using a gate insulating film having a high dielectric constant is required. Recently, silicon oxynitride (SiON) film having a high dielectric constant is used as a gate insulating film instead of a conventionally employed silicon oxide ($SiO_2$) film. However, improvement of the dielectric constant by the use of the silicon oxynitride film is deemed to have a limit, and a high-k insulating film having a higher dielectric constant is expected to be used as a promising next-generation gate insulating film. To be used for the high-k insulating film, $HfO_2$ or Hf-silicate film is most practical in consideration of a band gap, a dielectric constant and a thermal safety. However, as reported from recent researches, in the event that a poly-Si or metal gate electrode is used on the gate insulating film made of the $HfO_2$ or the Hf-silicate, a work function of the gate electrode varies 2)(Fermi level peening), causing a problem that a threshold voltage cannot be regulated at a desired value. Further, it is also known that carrier mobility deteriorates due to the influence of stationary charges in the insulating film, dipoles generated in an interface layer between the gate electrode and the insulating film, remote phonon scattering, and the like.

As a means to suppress the short channel effect while realizing the miniaturization of the MOSFET, there is known a method of increasing a doping concentration for the channel. However, the increase of the doping concentration would cause an increase of the threshold value over the desired level and a deterioration of the carrier mobility. In consideration of these problems, it is very difficult to enhance the driving capacity by the miniaturization, while concurrently realizing a reduction of the power consumption.

As a structure for improving the driving capacity by suppressing the short channel effect of the MOSFET, there is proposed a double gate structure. The double gate structure refers to a configuration in which a gate insulating film and a gate electrode portion are formed at two opposite thicknesswise surfaces of a semiconductor layer in which a channel is to be formed. The two gates serve to terminate lines of force of electric field from a drain of the MOSFET, and thus prevent an influence of a drain potential upon a source-side end of the channel, whereby the short channel effect is suppressed greatly.

As an actual double gate structure, there is proposed a fin-type field effect transistor (see, for example, Patent References 1 to 5).

In the fin-type field effect transistor, a fin-shaped semiconductor layer is formed on a semiconductor substrate with an insulating film interposed therebetween. A gate insulating film and a gate electrode are formed on both surfaces of the semiconductor layer while the semiconductor layer intervenes therebetween. Since the fin-type field effect transistor has the double gate structure, it can suppress the short channel effect. Accordingly, the doping concentration for the channel can be lowered. As a result, a threshold voltage can be regulated at a desired value, and carrier mobility improves. Furthermore, since channels are formed in the two surfaces, a driving current can be increased. Accordingly, by using a gate insulating film made of $HfO_2$ or Hf-silicate in the fin-type field effect transistor, increase of the driving current and suppression of the gate leakage current and the short channel effect can be all accomplished.

For the manufacture of the fin-type field effect transistor, a SOI wafer capable of reducing off-state leakage current is widely used. The SOI wafer has a laminated structure including a buried oxide layer made of an insulating material and a single crystalline silicon layer formed on a single crystalline substrate wafer. Here, the buried oxide layer is typically formed by a thermal oxidation method.

In the course of manufacturing the fin-type field effect transistor by using the SOI wafer, a fin is generally formed as follows. First, a fin-shaped protrusion is formed on the SOI wafer by performing a dry etching process such as plasma etching on the wafer. Here, the protrusion has a size larger than that of the fin to be finally formed. During the etching process, a damage by plasma or the like is inflicted on the surface of the protrusion.

In the subsequent process, to improve the surface roughness of the fin while narrowing the width thereof, a sacrificial oxide film is formed by oxidizing the surface of the protrusion including the damage and is removed by wet etching which is performed by using hydrofluoric acid or the like. As a result, a fin having a clean surface and a size smaller than that of the first-formed protrusion (a size almost equal to that of the fin to be finally formed) can be obtained.

The method of removing the damage, which is generated by the dry etching, by means of performing the wet etching of the sacrificial oxide film is a simple process. Further, this method enables a formation of a fin having a size that cannot be obtained by using only the dry etching (for example, having a width of about 30 to 40 nm).

However, if the SOI wafer is used as a wafer, that is, in the event that the fin-shaped protrusion is formed on the single crystalline silicon layer on the buried oxide layer by performing the dry etching thereon, and the damage inflicted on the protrusion is removed by the wet etching of the sacrificial oxide film, an undercut 12 would be generated at a base portion of the fin 11 to be formed, as shown in FIG. 4.

The undercut 12 is formed as follows. A top portion of the buried oxide layer 13 that has been exposed by the dry etching is etched together with the sacrificial oxide film when the wet etching of the sacrificial oxide film is performed (the buried oxide layer present before being etched by the wet etching is indicated by a dashed line), and an unexposed portion of the silicon oxide located directly under the fin 11 is partially etched (that is, side etching) due to the isotropy of the wet etching.

If such undercut is generated, residues of gate electrode material or the like would be left in that portion, raising a likelihood of an adverse influence upon a device performance (for example, such a degradation of transistor characteristics as an increase of off current or the like). Though it has been conventionally attempted to remove the residues by cleaning them with a liquid chemical or the like, the cleaning process is complicated, and, besides, it is very difficult to eliminate the residues completely through the cleaning process. Moreover, the presence of the undercut also raises a concern about the strength of the fin because there is a probability that the fin might collapse.

[Patent Reference 1]
Japanese Patent Laid-open Application No. 2003-204068
[Patent Reference 2]
Japanese Patent Laid-open Application No. 2004-128320
[Patent Reference 3]
Japanese Patent Laid-open Application No. 2005-332911
[Patent Reference 4]
U.S. Pat. No. 6,252,284, Specification
[Patent Reference 5]
U.S. Pat. No. 6,413,802, Specification

BRIEF SUMMARY OF THE INVENTION

In view of the foregoing, the present invention provides a method for manufacturing a fin-type field effect transistor simply and securely by using a SOI wafer, capable of suppressing an undercut formation at a base portion of a fin, and even capable of completely preventing the undercut formation so that the transistor substantially has no undercut, wherein the method includes a process of removing a damage, which is generated by dry etching, by performing an etching of a sacrificial oxide film.

In accordance with an embodiment of the present invention, there is provided a method for manufacturing a fin-type field effect transistor by using a SOI (Silicon On Insulator) wafer including, on a Si substrate, a buried oxide layer made of an insulating material and a single crystalline silicon layer formed thereon, the method including: forming a fin-shaped protrusion by selectively dry-etching the single crystalline silicon layer until the underlying buried oxide layer is exposed; forming a sacrificial oxide film by oxidizing a surface of the protrusion including a damage inflicted thereon; and forming a fin having a clean surface by removing the sacrificial oxide film by etching, wherein an etching rate $r_1$ of the sacrificial oxide film is higher than an etching rate $r_2$ Of the buried oxide layer during the etching.

In the embodiment, the sacrificial oxide film can be formed through a plasma oxidation process, and more particularly, can be formed through a plasma oxidation process of a RLSA (Radial Line Slot Antenna) microwave plasma type.

In the plasma process of the RLSA microwave plasma type, a processing gas containing a rare gas and an oxygen gas may be used, and more particularly, the processing gas containing an argon gas and an oxygen gas or the processing gas containing an argon gas, an oxygen gas and a hydrogen gas may be used.

Further, in the plasma process of the RLSA microwave plasma type, a processing temperature may be about 300 to 600° C., and more preferably, about 400 to 500° C.

In the embodiment, an etching rate ratio $r_1/r_2$ between the etching rate of the sacrificial oxide film and the etching rate of the buried oxide layer may be greater than or equal to about 1.2.

In the embodiment, the sacrificial oxide film can be removed by wet etching, and more preferably, hydrofluoric acid can be used as an etching solution for the wet etching.

In accordance with another embodiment of the present invention, there is provided a method for manufacturing a fin-type field effect transistor by using a SOI wafer including, on a Si substrate, a buried oxide layer made of an insulating material and a single crystalline silicon layer formed thereon, the method including: forming a fin-shaped protrusion by selectively dry-etching the single crystalline silicon layer until the underlying buried oxide layer is exposed; forming a sacrificial oxide film by oxidizing a surface of the protrusion including a damage inflicted thereon; and forming a fin having a clean surface by removing the sacrificial oxide film by wet etching, wherein an etching rate of the sacrificial oxide film is higher than an etching rate of the buried oxide layer for an etching solution used in the wet etching.

(1) As described, the manufacturing method in accordance with the present invention is performed by using the SOI wafer and includes the process of removing the damage, which is generated by the dry etching, by means of performing the etching of the sacrificial oxide film. The method allows simply and securely forming a fin-type electric field effect transistor in which an undercut formation is suppressed. That is, by setting the etching rate $r_1$ of the sacrificial oxide film to be higher than the etching rate $r_2$ of the buried oxide layer, the removal of the sacrificial oxide film can be completed before the etching of the buried oxide layer progresses considerably, which causes the undercut formation. As a result, in the fin-type field effect transistor finally obtained, the undercut formation at the base portion of the fin is suppressed. Here, if the removal of the sacrificial oxide film can be completed before the etching of the buried oxide layer starts, the undercut would not be formed substantially.

(2) The sacrificial oxide film formed by the plasma process, especially, by the plasma process of the RLSA microwave plasma type, has a higher etching rate for hydrofluoric acid than the buried oxide layer formed by a thermal oxidation method. Accordingly, by forming the sacrificial oxide film through the plasma process (especially, through the plasma process of the RLSA microwave plasma type), it is possible to securely manufacture a fin-type electric field effect transistor substantially having no undercut at a fin base portion.

(3) The sacrificial oxide film formed by the plasma process, especially, by the plasma process of the RLSA microwave plasma type, has a higher surface flatness than a sacrificial oxide film formed by a thermal oxidation method. Further, a fin, which is obtained after the sacrificial oxide film formed by the plasma process is removed, has a higher surface flatness than a fin obtained after the sacrificial oxide film formed by the thermal oxidation method is removed.

BRIEF DESCRIPTION OF THE DRAWINGS

The above and other features of the present invention will become apparent from the following description of embodiments, given in conjunction with the accompanying drawings in which.

DETAILED DESCRIPTION OF THE INVENTION

Hereinafter, an embodiment of the present invention will be described.

FIGS. 1A to 1F provide cross sectional views to describe a process sequence of a manufacturing method for a fin-type field effect transistor in accordance with an embodiment of the present invention. The manufacturing method in accordance with the embodiment is performed by using a SOI (Silicon On Insulator) wafer, and the method involves the steps of forming a protrusion by dry etching, forming a sacrificial oxide film on the protrusion, and removing the sacrificial oxide film by wet etching.

Figure 1A:
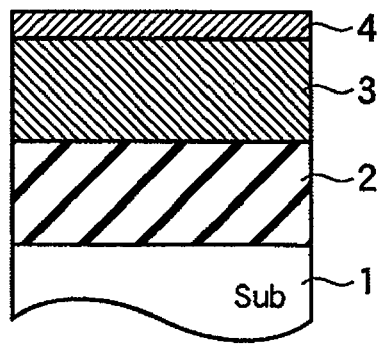
FIGS. 1A to 1F provide cross sectional views to describe a process sequence of a manufacturing method in accordance with an embodiment of the present invention.

In the embodiment, a SOI wafer having a multilayer structure shown in FIG. 1A is first prepared. The SOI wafer includes a silicon substrate 1 made of single crystalline silicon, a buried oxide layer 2, a single crystalline silicon layer 3 and a hard mask 4 that are laminated in sequence.

The buried oxide layer 2 is made of $SiO_2$ formed by a thermal oxidation method. Here, a thermal oxidation temperature for forming the buried oxide layer 2 is, for example, about 850° C.

The thickness of the buried oxide layer 2 ranges from, for example, about 130 to 160 nm. The buried oxide layer 2 in this thickness range can suppress off-state leakage current of the field effect transistor sufficiently.

The thickness of the single crystalline silicon layer 3 on the buried oxide layer 2 defines the height of a fin to be finally formed, and the thickness ranges from, for example, about 30 to 200 nm.

The hard mask 4 on the single crystalline silicon layer 3 is made of, for example, SiN, and its thickness is, for example, about 10 to 100 nm.

Figure 1B:
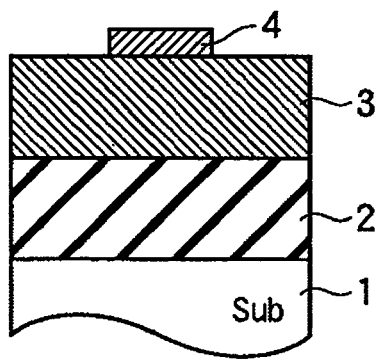

In the step of forming a protrusion by dry etching, a lithography and dry etching process is performed according to a method conventionally known in the art, whereby the hard mask 4 is partially removed, as illustrated in FIG. 1B.

Figure 1C:
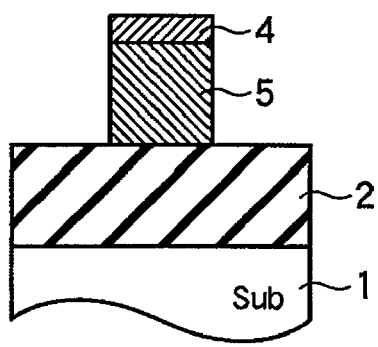
Figure 1D:
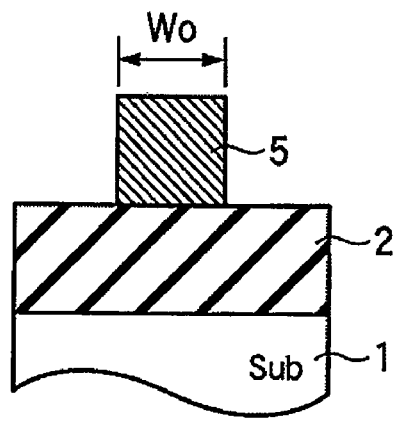

Subsequently, a surface portion of the single crystalline silicon layer 3 exposed after the partial removal of the hard mask 4 is eliminated by performing dry etching until the buried oxide layer 2 is exposed. As a result, a fin-shaped protrusion 5 is formed on the buried oxide layer 2, as shown in FIG. 1C. Thereafter, by using a phosphoric acid and hydrofluoric acid process, the hard mask 4 on the protrusion 5 is removed, as illustrated in FIG. 1D.

The dry etching for forming the protrusion 5 is not limited to any specific method but can be carried out according to a typical method by using a conventionally known plasma etching apparatus or the like. Since a damaged layer is generated during the dry etching, the width of the protrusion 5 needs to be set larger than that of a fin to be finally formed, so as to obtain an extra width to be removed with the damaged layer when the damaged layer is eliminated.

For example, when a fin having a width W of about 30 to 40 nm is formed, the width $W_0$ of the protrusion 5 is preferably set to be about 60 to 80 nm. In such case, a ratio of the width $W_0$ of the protrusion 5 to the width W of the fin ($W_0/W$) is preferably determined in the range of about 1.5 to 2.0.

If the ratio $W_0/W$ is less than 1.5, a sufficient amount of extra width to be removed with the damaged layer cannot be obtained. Meanwhile, if the ratio $W_0/W$ is larger than 2.0, the removed amount would become excessive, causing such problems as the removal of the sacrificial oxide film taking a long time or the etching of the buried oxide layer 2 progressing more than necessary.

Figure 1E:
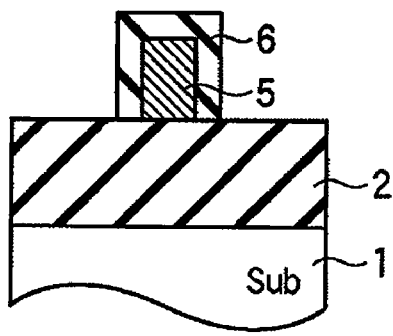

In the step of forming a sacrificial oxide film on the protrusion 5, the surface of the protrusion 5 including a damage is oxidized, whereby a sacrificial oxide film 6 is formed, as shown in FIG. 1E.

To form a fin with a clean surface through the subsequent wet etching step, the sacrificial oxide film 6 needs to have a film thickness capable of including a region where the damage of the protrusion 5 exists (i.e., the damaged layer). The film thickness of the sacrificial oxide film 6 is, for example, about 30 to 40 nm, and this thickness can be properly adjusted by controlling processing conditions for the oxidation process.

Here, an etching rate $r_1$ of the sacrificial oxide film 6 for an etching solution, typically, hydrofluoric acid, is required to be higher than an etching rate $r_2$ of the buried oxide layer 2 ($SiO_2$ layer formed by the thermal oxidation method) for the etching solution.

If the etching rate $r_1$ of the sacrificial oxide film 6 is higher than the etching rate $r_2$ of the buried oxide layer 2, the removal of the sacrificial oxide film can be completed in the subsequent sacrificial oxide film removing step before the etching of the buried oxide layer, which causes an undercut formation, progresses considerably. That is, since the undercut formation has yet to progress so much at the point of completion of the removal of the sacrificial oxide film, an undercut formation at a base portion of a fin is suppressed in a fin-type electric field effect transistor finally obtained. In this step of removing the sacrificial oxide film, it is preferable to complete the removal of the sacrificial oxide film before the etching of the buried oxide layer even starts. In such case, since the etching of the buried oxide layer does not progress to the extent that an undercut formation takes place, substantially no undercut will be formed at the fin base portion of the obtained fin-type field effect transistor.

It is desirable that an etching rate ratio $r_1/r_2$ is set to be higher than 1.0. Preferably, the etching rate ratio $r_1/r_2$ is no smaller than 1.2 and, more preferably, it is determined in the range of about 1.2 to 1.6.

To form the sacrificial oxide film 6 (that is, to oxidize the surface of the protrusion 5), there can be employed an oxidation method by using a plasma oxidation process, that is, a method of exposing the protrusion 5 to a plasma including reactant species (radicals and/or ions) induced from an oxygen gas.

A plasma process of a RLSA (Radial Line Slot Antenna) microwave plasma type is particularly preferable as the plasma oxidation process for forming the sacrificial oxide film 6.

Since the plasma process of the RLSA microwave plasma type enables a low-temperature processing at a low electron temperature with a high-density plasma, a silicon oxide film (sacrificial oxide film) having a high etching rate for various etching solutions including the hydrofluoric acid can be formed, and the sacrificial oxide film thus formed has a surface flatness higher than that formed by a thermal oxidation method. Furthermore, a plasma damage upon an under layer hardly occurs, and a surface flatness of a fin after the removal of the sacrificial oxide film is also high. In addition, it is also possible to avoid degradation of device characteristics due to high-temperature processing conditions, which is highly likely to occur when the thermal oxidation method is employed.

Figure 2:
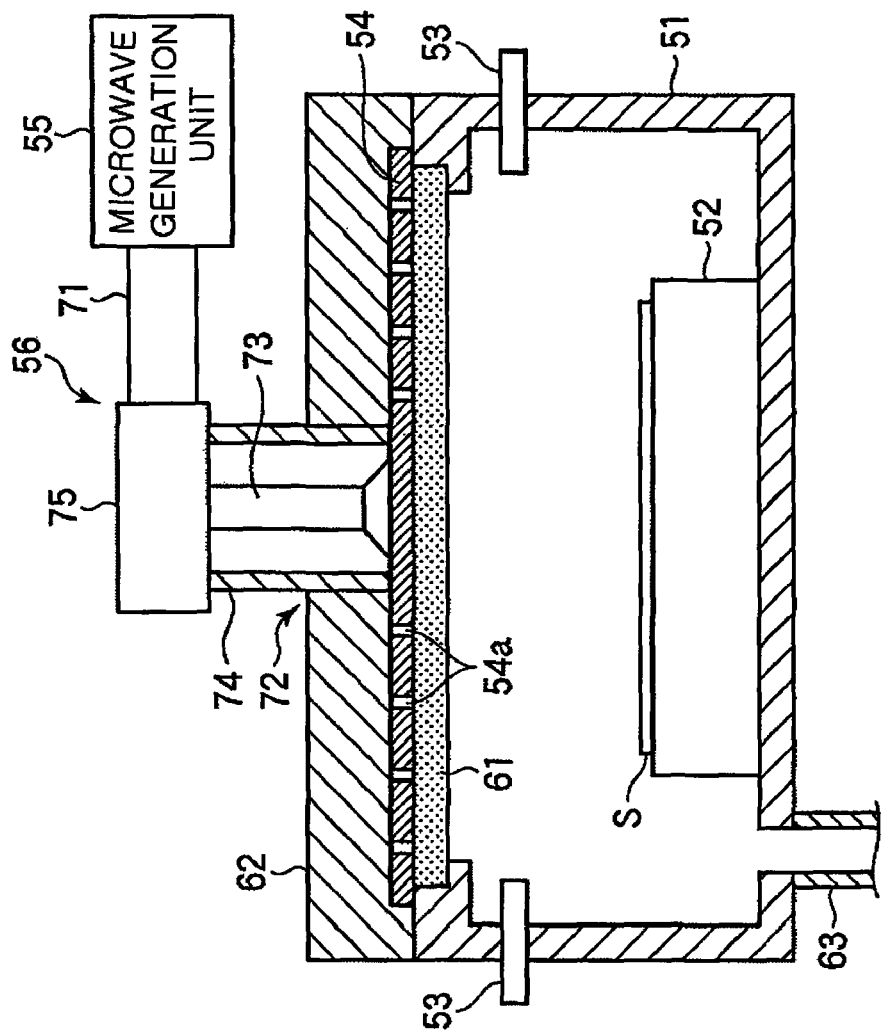
FIG. 2 sets forth a cross sectional view showing an example plasma processing apparatus used to perform the manufacturing method in accordance with the embodiment of the present invention.

As a plasma processing apparatus of such RLSA microwave plasma type, there is known one disclosed in International Publication No. 02/058130, and this plasma processing apparatus can be employed in the present embodiment. Specifically, as shown in FIG. 2, the plasma processing apparatus includes a substantially cylindrical chamber 51; a susceptor 52 disposed in the chamber 51; a gas inlet unit 53 disposed in a sidewall of the chamber 51; a planar antenna 54 disposed to face a top opening of the chamber 51 and provided with a number of microwave transmission holes 54a; a microwave generation unit 55 for generating a microwave; and a microwave transmission mechanism 56 for inducing the microwave from the microwave generation unit 55 to the planar antenna 54. Installed under the planar antenna 54 is a microwave transmission plate 61 made of a dielectric material, and a shield member 62 is provided to cover the planar antenna 54. The microwave transmission mechanism 56 includes a horizontally extending waveguide 71 for inducing the microwave from the microwave generation unit 55; a coaxial waveguide 72 having an internal conductor 73 and an external conductor 74, both extending upward from the planar antenna 54; and a mode transducer 75 disposed between the horizontally extending waveguide 71 and the coaxial waveguide 72. Further, a reference numeral 63 denotes a gas exhaust pipe.

In the plasma processing apparatus configured as described above, a microwave generated by the microwave generation unit 55 is allowed to propagate to the planar antenna 54 in a specific mode via the microwave transmission mechanism 56 to be uniformly provided into the chamber 51 via the microwave transmission holes 54a of the planar antenna 54 and the microwave transmission plate 61. By the microwave thus provided, a processing gas containing a rare gas and an oxygen gas supplied from the gas inlet unit 53 is converted into a plasma, and the single crystalline silicon of the protrusion 5 formed on the SOI wafer S is oxidized by the plasma (reactant species induced from the oxygen gas), whereby a silicon oxide film ($SiO_2$ film) is formed.

In the plasma process of the RLSA microwave plasma type, it is preferable to use the processing gas including the rare gas and the oxygen gas. Here, the rare gas may be helium (H), argon (Ar), krypton (Kr), xenon (Xe) or the like, and among them, argon is most preferable.

To be more specific, a gaseous mixture of an argon gas and an oxygen gas or a gaseous mixture of an argon gas, an oxygen gas and a hydrogen gas can be exemplified as a preferable processing gas.

A processing temperature (oxidation temperature) for the plasma process of the RLSA microwave plasma type is preferably about 300 to 600° C., and, more preferably, about 400 to 500° C. If the processing temperature is excessively high, the above-mentioned effects of using the RLSA microwave type cannot be obtained sufficiently. Meanwhile, if the processing temperature is too low, an oxidation rate is lowered greatly, resulting in a reduction of production yield.

In the plasma process of the RLSA microwave plasma type, a processing pressure is preferably in the range of about 0.1 to 1 Torr (13.3 to 133 Pa), and, more preferably, in the range of about 0.1 to 0.5 Torr (13.3 to 66.5 Pa).

A microwave output is preferably about 2 to 4 W/cm², and more preferably, about 2.5 to 4 W/cm².

A flow rate of the rare gas is preferably about 100 to 2,000 mL/min (sccm), and, more preferably, 500 to 1,000 mL/min (sccm).

A flow rate of the oxygen gas is preferably about 5 to 50 mL/min (sccm), and, more preferably, 5 to 10 mL/min (sccm).

Figure 3:
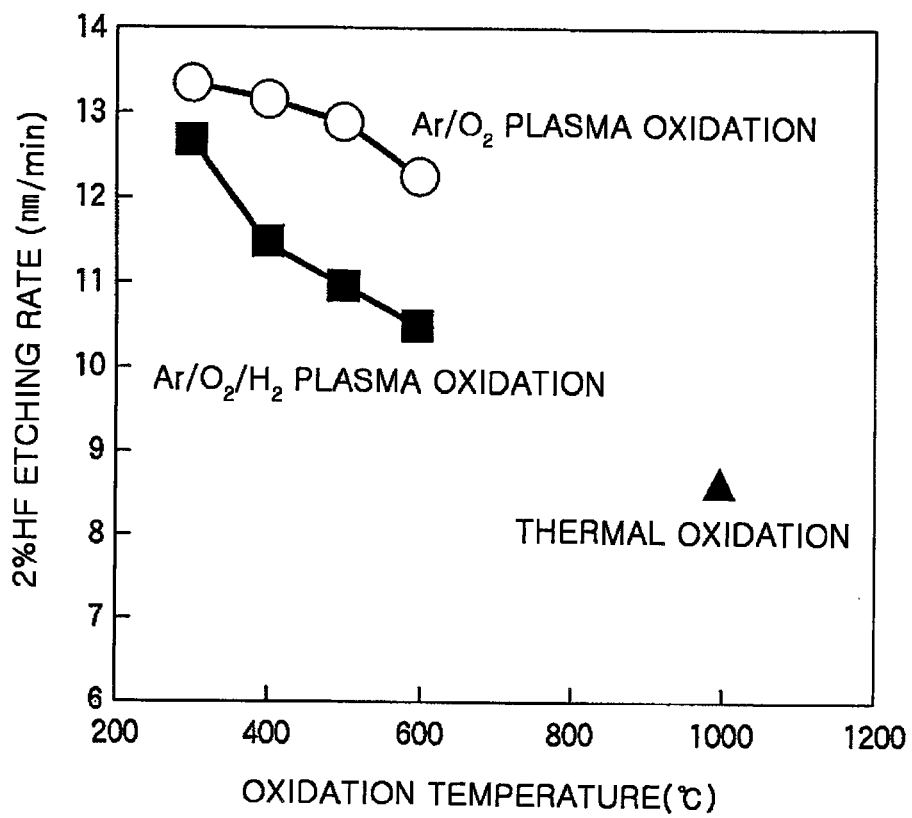
FIG. 3 presents an explanatory diagram to describe a relationship between a processing temperature for forming a silicon oxide film and an etching rate of the silicon oxide film.
Figure 4:
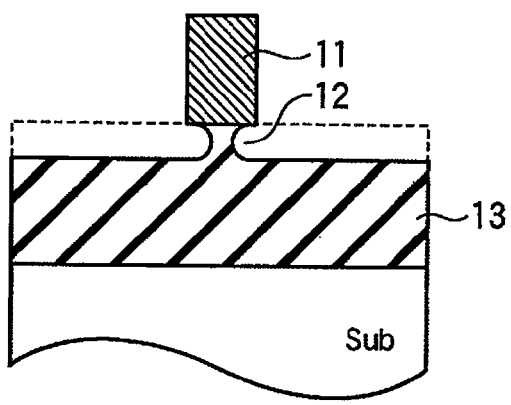
FIG. 4 provides a cross sectional view showing a state where an undercut is formed at a base portion of a fin by using a conventional manufacturing method.

FIG. 3 shows a relationship between a processing temperature (300 to 600° C.) and an etching rate of a silicon oxide film, which is formed by the plasma process of the RLSA microwave plasma type, for 2% hydrofluoric acid. Further, in FIG. 3, there is also specified an etching rate of a silicon oxide film, which is formed by the thermal oxidation method (of which processing temperature is 1000° C.), for the hydrofluoric acid.

Here, in the plasma process, measurements are conducted for respective cases of using the gaseous mixture of the argon gas and the oxygen gas (indicated by —O—) and the gaseous mixture of the argon gas, the oxygen gas and the hydrogen gas (indicated by —■—).

As revealed from the measurement result shown in FIG. 3, the silicon oxide film (corresponding to the sacrificial oxide film 6) formed by the plasma process of the RLSA microwave plasma type has a higher etching rate for the hydrofluoric acid than that of the silicon oxide film (corresponding to the buried oxide layer 2) formed by the thermal oxidation method.

Furthermore, a silicon oxide film formed by oxidizing polysilicon through the plasma process of the RLSA microwave plasma type has a surface roughness of 4.3 nm, whereas a silicon oxide film formed by oxidizing polysilicon through the thermal oxidation method has a surface roughness of 4.6 nm. From this result, the silicon oxide film formed by the plasma process is deemed to be superior to the silicon oxide film formed by the thermal oxidation method in the aspect of surface flatness.

Figure 1F:
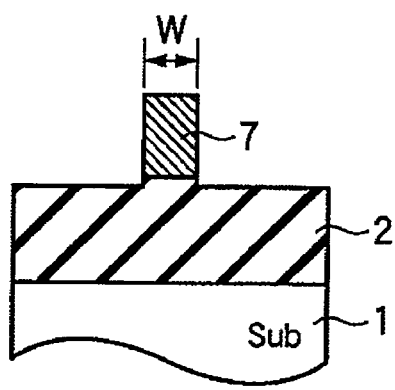

In the step of removing the sacrificial oxide film 6 by the wet etching, the sacrificial oxide film 6 is removed by using a proper etching solution, as illustrated in FIG. 1F. Here, as the proper etching solution, a liquid chemical that is capable of etching the silicon oxide but does not etch the single crystalline silicon (thus inflicting no damage upon an under layer to be formed as a fin) is selected. Further, as another requirement for the etching solution, the etching rate of the sacrificial oxide film 6 should be higher than that of the buried oxide layer 2 when the liquid chemical is used. Specifically, it is preferable to use hydrofluoric acid having a HF concentration of about 0.5 to 5 weight %.

By removing the sacrificial oxide film 6, the damage inflicted on the surface of the protrusion 5 by the plasma etching is eliminated, so that a fin 7 having a clean surface is formed on the buried oxide layer 2. The fin 7 thus formed has a width W of, for example, about 30 to 40 nm.

In the step of removing the sacrificial oxide film 6, the buried oxide layer 2 made of the silicon oxide is etched together with the sacrificial oxide film 6. Since, however, the etching rate of the sacrificial oxide film 6 formed by the plasma process is higher than that of the buried oxide layer 2 formed by the thermal oxidation method, an undercut in the buried oxide layer 2 would not progress so much at the point of completion of the removal of the sacrificial oxide film 6, so that the undercut at a base portion of the fin 7 can be suppressed in the fin-type electric field effect transistor finally obtained. By adjusting the processing conditions properly, it is possible to avoid the undercut formation in the buried oxide layer 2 at the point of completion of the removal of the sacrificial oxide film 6, and it is also possible to fabricate a fin-type electric field effect transistor which has substantially no undercut at the base portion of the fin 7.

Moreover, after the sacrificial oxide film 6 is removed by the plasma oxidation process, particularly, by the RLSA microwave plasma type, the surface of the fin 7 is given a high flatness. Further, since the plasma oxidation process of the RLSA microwave plasma type is carried out at a low temperature (for example, 300 to 600° C.), degradation of device characteristics is not incurred.

After the completion of the aforementioned steps, formation of gate wiring, formation of diffusion area, and the like are performed in typical ways, whereby the desired fin-type field effect transistor is finally obtained.

With regard to the fin-type field effect transistor manufactured in accordance with the embodiment of the present invention, an undercut generation at the base portion of the fin 7 is suppressed, and, preferably, no undercut is formed substantially. Therefore, it is possible to avoid an adverse influence upon device characteristics due to the presence of residues of gate wiring materials or the like in the undercut. Moreover, since the fin 7 is strongly supported by the buried oxide layer 2, the fin is prevented from collapsing, so there arises no concern about the strength of the fin.

It is to be noted that the manufacturing method of the present invention is not limited to the embodiment described above.

For example, though the embodiment has been described for the case of performing the wet etching by the hydrofluoric acid as a process to remove the sacrificial oxide film, the etching solution is not limited to the hydrofluoric acid but various other types can be used. Furthermore, instead of the wet etching process, it is possible to employ a process of reforming the sacrificial oxide film by supplying, to the sacrificial oxide film, reactant species induced from a nitrogen or a nitrogen compound (for example, an $NH_3$ gas) and reactant species induced from a fluorine or a fluorine compound (for example, an HF gas), while concurrently vaporizing (etching) the sacrificial oxide film by heating it. Since this process is plasma-less, it is possible to perform a dry process accompanying a low damage. In such case, by reforming the sacrificial oxide film primarily and selectively by optimizing the supply process of the reactant species, it is possible to remove the sacrificial oxide film selectively. This method of removing the sacrificial oxide film by reforming and vaporizing it provides anisotropy of etching, so even in case an exposed portion of the buried oxide layer is etched to some degree, a side etching of the silicon oxide directly under the fin (unexposed portion of the buried oxide layer) is likely to be prevented effectively.

Furthermore, beside the above-mentioned process, a process of removing the sacrificial oxide film by supplying radicals such as NF radicals by remote plasma or the like can also be employed. This process is also a low-damage process, so it is applicable to the present invention.

While the invention has been shown and described with respect to the embodiments, it will be understood by those skilled in the art that various changes and modifications may be made without departing from the scope of the invention as defined in the following claims.

What is claimed is:

1. A method for manufacturing a fin-type field effect transistor by using a SOI (Silicon On Insulator) wafer including, on a Si substrate, a buried oxide layer made of an insulating material and a single crystalline silicon layer formed thereon, the method comprising:
    forming a fin-shaped protrusion by selectively dry-etching the single crystalline silicon layer until the underlying buried oxide layer is exposed;
    forming a sacrificial oxide film by oxidizing a surface of the protrusion including a damage inflicted thereon; and
    forming a fin having a clean surface by removing the sacrificial oxide film by etching,
    wherein an oxidizing method for forming the buried oxide layer is different from an oxidizing method for forming the sacrificial oxide film, so that an etching rate $r_1$ of the sacrificial oxide film is higher than an etching rate $r_2$ of the buried oxide layer during the etching, and
    wherein both the buried oxide layer and the sacrificial oxide film are made of $SiO_2$.

2. The method of claim 1, wherein the sacrificial oxide film is formed through a plasma oxidation process and the buried oxide layer is formed by a thermal oxidizing method.

3. The method of claim 1, wherein the sacrificial oxide film is formed through a plasma oxidation process of a RLSA (Radial Line Slot Antenna) microwave plasma type.

4. The method of claim 3, wherein a processing gas containing a rare gas and an oxygen gas is used in the plasma process of the RLSA microwave plasma type.

5. The method of claim 4, wherein the processing gas containing an argon gas and an oxygen gas is used in the plasma process of the RLSA microwave plasma type.

6. The method of claim 3, wherein a processing gas containing an argon gas, an oxygen gas and a hydrogen gas is used in the plasma process of the RLSA microwave plasma type.

7. The method of claim 3, wherein a processing temperature is about 300 to 600° C. in the plasma process of the RLSA microwave plasma type.

8. The method of claim 3, wherein a processing temperature is about 400 to 500° C. in the plasma process of the RLSA microwave plasma type.

9. The method of claim 1, wherein the sacrificial oxide film is removed by wet etching.

10. The method of claim 9, wherein hydrofluoric acid is used as an etching solution for the wet etching.

11. The method of claim 1, wherein an etching rate ratio $r_1/r_2$ between the etching rate of the sacrificial oxide film and the etching rate of the buried oxide layer is greater than or equal to about 1.2.

* * * * *